United States Patent
Zimmermann et al.

(10) Patent No.: US 8,097,955 B2
(45) Date of Patent: Jan. 17, 2012

(54) INTERCONNECT STRUCTURES AND METHODS

(75) Inventors: Bernd Zimmermann, Dresden (DE); Volker Berghof, Dresden (DE); Stefan Ruckmich, Dresden (DE); Thorsten Schedel, Dresden (DE)

(73) Assignee: Qimonda AG, Munich (DE)

( * ) Notice: Subject to any disclaimer, the term of this patent is extended or adjusted under 35 U.S.C. 154(b) by 349 days.

(21) Appl. No.: 12/252,236

(22) Filed: Oct. 15, 2008

(65) Prior Publication Data

US 2010/0090317 A1    Apr. 15, 2010

(51) Int. Cl.
 *H01L 23/48* (2006.01)
 *H01L 23/52* (2006.01)
 *H01L 29/40* (2006.01)

(52) U.S. Cl. ......... 257/777; 257/621; 257/775; 257/686

(58) Field of Classification Search .................. 257/621, 257/777, 775, 686
See application file for complete search history.

(56) References Cited

U.S. PATENT DOCUMENTS

| 7,262,495 B2 | 8/2007 | Chen et al. | |
|---|---|---|---|
| 2004/0178491 A1* | 9/2004 | Akram et al. | 257/686 |
| 2009/0108468 A1* | 4/2009 | Han | 257/777 |

* cited by examiner

*Primary Examiner* — Ha Tran T Nguyen
*Assistant Examiner* — Aaron Dehne
(74) *Attorney, Agent, or Firm* — John S. Economou

(57) ABSTRACT

Interconnect structures and methods are disclosed. In one embodiment, an interconnect structure includes a via extendable through a workpiece from a first side of the workpiece to a second side of the workpiece. The via is partially filled with a conductive material and has sidewalls. The interconnect structure includes a contact coupled to the conductive material in the via proximate the first side of the workpiece. The conductive material in the via comprises a recessed region comprising a landing zone proximate the second side of the workpiece.

14 Claims, 7 Drawing Sheets

INTERCONNECT STRUCTURES AND METHODS

TECHNICAL FIELD

The present invention relates generally to semiconductor devices, and more particularly to interconnect structures and methods.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Semiconductor devices are typically packaged as single die or in multi-chip modules. Many different types of packaging are used, and packaging techniques have changed throughout the years as semiconductor devices are scaled down in size and according to the end application. Factors such as performance, size, weight, and operating conductions influence the type of packaging selected. In-line packages, small outline packages, quad surface mount, and array packages are examples of some major package families.

A recent trend in semiconductor packaging is three dimensional (3D) packaging or wafer stacking. Flip-chip packages are one such packaging technique, where gold bumps or solder ball techniques are used to bond one substrate to another. The use of through-silicon vias (TSV's) has been explored for 3D packaging interconnects, where two die or integrated circuits are bonded together and through-silicon vias, front side contacts, and back side contacts are used to make connections between the two die. However, alignment marks and alignment procedures are required to align the two die using this method, which requires additional manufacturing and processing steps and may result in misalignment between the die.

Thus, what are needed in the art are improved structures and methods for connecting together two die or workpieces.

SUMMARY OF THE INVENTION

These and other problems are generally solved or circumvented, and technical advantages are generally achieved, by preferred embodiments of the present invention, which provide novel interconnect structures and methods.

In accordance with one embodiment of the present invention, an interconnect structure includes a via extendable through a workpiece from a first side of the workpiece to a second side of the workpiece. The via is partially filled with a conductive material and has sidewalls. The interconnect structure includes a contact coupled to the conductive material in the via proximate the first side of the workpiece. The conductive material in the via comprises a recessed region comprising a landing zone proximate the second side of the workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
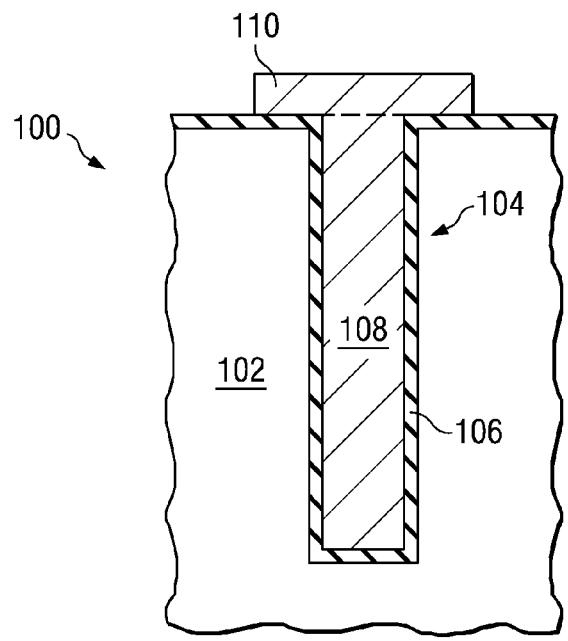
FIGS. 1 through 3 show cross-sectional views of a prior art method of connecting together two semiconductor die using through-silicon vias.
Figure 2:
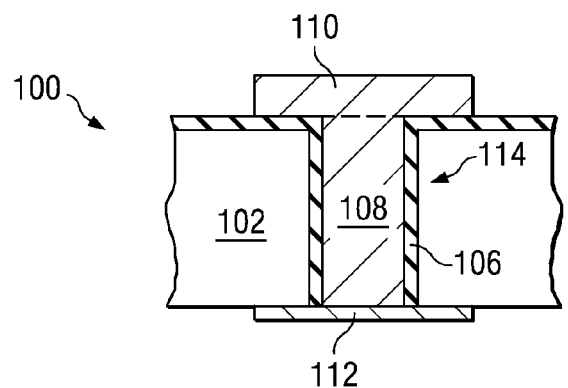
Figure 3:
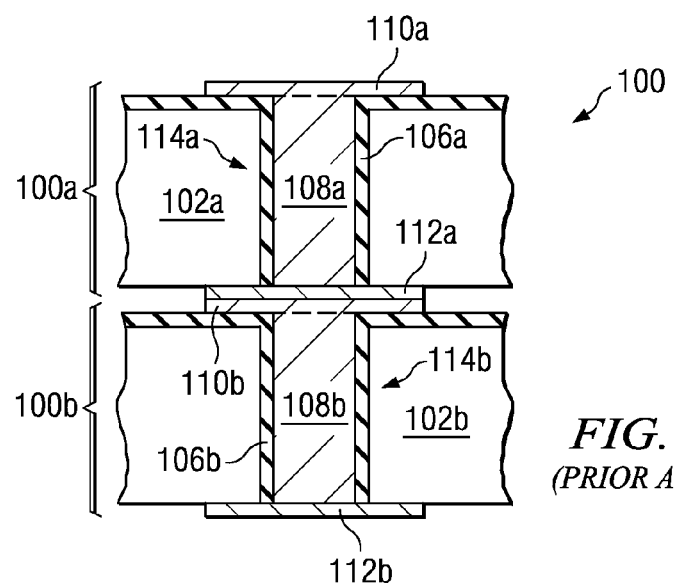

FIGS. 1 through 3 show cross-sectional views of a prior art method of connecting together two semiconductor die or devices 100 using through-silicon vias 114a. FIG. 1 shows a workpiece 102 comprising a semiconductor wafer that comprises a semiconductor material such as silicon. Through-silicon vias 114a are formed by etching a via 104 partially through the workpiece 102, e.g., using lithography. An insulating material layer 106 comprising an insulator is formed over the workpiece 102, lining the via 104. A conductive material 108 is deposited over the workpiece 102, filing the lined via 104. Front side contacts 110 are formed by depositing a conductive material over the workpiece 102 and patterning the conductive material using lithography.

The back side of the workpiece 102 is ground, thinning the workpiece 102 and forming a through-silicon via 114, as shown in FIG. 2. Back side contacts 112 are formed on the back side of the workpiece 102 by depositing a conductive material on the back side and patterning the conductive material using lithography. An insulating material may be deposited on the back side of the workpiece 102 before depositing the conductive material for the back side contacts 112, not shown.

Two chips or workpieces 102a and 102b are joined together by stacking two workpieces 102a and 102b such that the back side contact 112a of one semiconductor device 100a is connected to a front side contact 110b of another semiconductor device 100b, as shown in FIG. 3. The through-silicon vias 114a and 114b of the two semiconductor devices 100a and 100b provide electrical connection between the two semiconductor devices 100a and 100b.

However, the prior art technology shown in FIGS. 1 through 3 requires alignment marks at the wafer back side and/or tooling process that provide the ability to align the back side with the front side alignment marks (not shown in the drawings), in order to process the interconnent elements and backside passivation, for example. Furthermore, a backside interconnect system, e.g., contacts 112a and 112b, is needed for the through-silicon via chip stacking, for which a complete set of wafer back-side processes is needed, which includes a deposition process of the conductive material for the contacts 112a and 112b, a lithography process, a patterning process, and an etch process to form the contacts 112a and 112b.

Embodiments of the present invention achieve technical advantages by providing plug-in interconnect structures that do not require wafer backside interconnect processing and structures. The interconnect structures provide advanced through-silicon via chip stacking with modified back side contacts that comprise recessed landing zones. Furthermore, the novel interconnect structures avoid the need for backside alignment processes and alignment marks.

The present invention will be described with respect to preferred embodiments in a specific context, namely implemented as interconnect structures for semiconductor devices. The invention may also be applied, however, to other applications that utilize through-substrate vias, such as solar cell devices and other devices that are typically formed on a workpiece, as examples.

FIGS. 4 through 7 show cross-sectional views of a method of connecting together two workpieces 102a, and 102b (see FIG. 7) in accordance with an embodiment of the present invention. The workpieces 102a and 102b are connected together using interconnect structures 132a and 132b that comprise novel through-silicon vias. The interconnect structure 132 (see FIG. 6) includes a via 104 extendable through a workpiece 102 from a first side of the workpiece 102 to a second side of the workpiece 102. The first side comprises the top side of the workpiece 102, and the second side comprises the bottom side of the workpiece 102 in the drawings, for example. The via 104 is partially filled with a conductive material 108 and has sidewalls. The interconnect structure 132 includes a contact 122 coupled to the conductive material 108 in the via 104 proximate the first side of the workpiece 102. The interconnect structure 132 includes a recessed region 130 (see FIG. 6) in the conductive material 108 in the via 104 proximate the second side of the workpiece 102. The recessed region 130 of the interconnect structure 132 comprises a landing zone for a contact 122 of another workpiece 102, to be described further herein.

Figure 4:
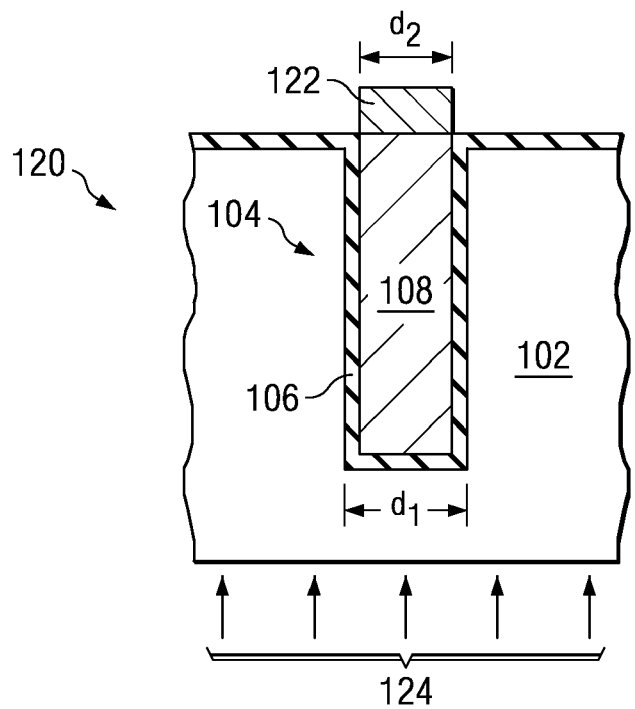
FIGS. 4 through 7 show cross-sectional views of an interconnect structure and method of connecting together two workpieces in accordance with an embodiment of the present invention.

With reference next to FIG. 4, there is shown a semiconductor device 120 in accordance with an embodiment of the present invention. To manufacture the semiconductor device 120, a workpiece 102 is provided. The workpiece 102 may include a semiconductor substrate, body, or wafer comprising silicon or other semiconductor materials and may be covered by an insulating layer, for example. The workpiece 102 may also include active areas, electrical components, or circuits, not shown. The workpiece 102 may comprise silicon oxide over single-crystal silicon, for example. The workpiece 102 may include conductive layers or semiconductor elements, e.g., transistors, diodes, CMOS devices, etc., not shown. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

An interconnect structure 132 (see FIG. 6) comprising a through-silicon via is formed by etching a via 104 partially through the workpiece 102 using lithography. For example, a layer of photosensitive material (not shown) such as a photoresist may be deposited over the workpiece 102, and the layer of photosensitive material may be patterned using a lithography mask and lithography system, by exposing the layer of photosensitive material to energy through the mask, as an example. Alternatively, direct patterning methods may also be used. The layer of photosensitive material is developed, and the layer of photosensitive material is then used as an etch mask while portions of the workpiece 102 are etched away using an etch process, forming the vias 104 in the workpiece 102. The via 104 may be formed using a dry etch process in a front end manufacturing process, for example. The layer of photosensitive material is then removed.

A hard mask, not shown, may optionally be formed over the workpiece 102 before forming the layer of photosensitive material over the workpiece 102, and the hard mask or the hard mask and the layer of photosensitive material may be used as a mask while the workpiece 102 is patterned to form the via 104, for example.

Only one via 104 is shown in FIGS. 4 through 7; alternatively, a plurality of vias 104 may be formed simultaneously across the surface of the workpiece 102, for example, not shown. The via 104 comprises an aperture or hole in the workpiece 102 which may be circular, elliptical, square, or rectangular in a top view of the workpiece 102, for example, although alternatively, the via 104 may comprise other shapes. The via 104 may comprise a width or dimension $d_1$, wherein dimension $d_1$ may comprise about 1 μm to several μm, as examples, although alternatively, dimension $d_1$ may comprise other dimensions. Dimension $d_1$ may comprise about 10 to 20 μm in some embodiments, for example. The via 104 may extend into the workpiece 102 by about several μm, for example.

An insulating material layer 106 comprising an insulator such as an oxide, nitride, combinations thereof, or other dielectric materials is formed over the workpiece 102, lining the via 104 and the top surface of the workpiece 102. The insulating material layer 106 may be substantially conformal, as shown, and may line the sidewalls and the bottom surface of the via 104. The insulating material layer 106 may comprise a thickness of about 500 to 800 nm, for example, although alternatively, the insulating material layer 106 may comprise other dimensions. The insulating material layer 106 may comprise silicon dioxide formed by a thermal oxidation process in some embodiments, as an example.

A conductive material 108 is deposited over the workpiece 102, filling the via 104 lined with the insulating material layer 106. The conductive material 108 may comprise copper, aluminum, tin, nickel, silver, alloys thereof or of other metals, or other conductive materials. The conductive material 108 may include one or more seed layers and may include one or more conductive liners, such as Ta, Ti, W, combinations thereof, combinations thereof with N, or other materials, as examples. Alternatively, the conductive material 108 may comprise other materials.

Excess conductive material 108 may be removed from over the top surface of the workpiece 102, e.g., using a chemical mechanical polishing process (CMP) and/or etch process, leaving the conductive material 108 remaining within the via 104 and extending to the top surface of the insulating material layer 106.

A contact 122 may be formed on the first side or top side of the workpiece 102 by depositing a conductive material over the workpiece 102 and patterning the conductive material using lithography to form the contact 122. Alternatively, a portion of the conductive material 108 used to fill the via 104 may be left remaining over the top surface of the workpiece 102, e.g., over the insulating material layer 106, and the portion of the conductive material 108 disposed over the top surface of the workpiece 102 may be patterned to form the contact 122. A plurality of contacts 122 may be formed over a plurality of vias 104 adjacent to and electrically coupled to the conductive material 108 in the vias 104, for example, not shown.

The contact 122 comprises a "front side contact" in accordance with some embodiments of the present invention. The contact 122 may comprise similar materials as described for the conductive material 108, for example. The contact 122 may comprise a thickness of about 4 to 10 µm for example, although alternatively, the contact 122 may comprise other dimensions. The contact 122 may comprise a height or thickness that is substantially the same as the amount of recess of the recessed region 130, to be described further herein with reference to FIG. 6. The contact 122 comprises a plug contact that protrudes from the first side of the workpiece 102, as shown.

The contact 122 may comprise a width or dimension $d_2$ that is substantially the same as the width of the via 104 or dimension $d_1$ in some embodiments. The contact 122 may alternatively comprise a width or dimension $d_2$ that is less than the width of the via 104 or dimension $d_1$, in other embodiments, as shown in FIG. 4, e.g., by the thickness of the insulating material layer 106. In other embodiments, the contacts 122 may comprise a width or dimension $d_2$ that is greater than the width of the via 104 or dimension $d_1$, to be described with reference to the embodiment shown in FIGS. 8 through 14.

Figure 5:
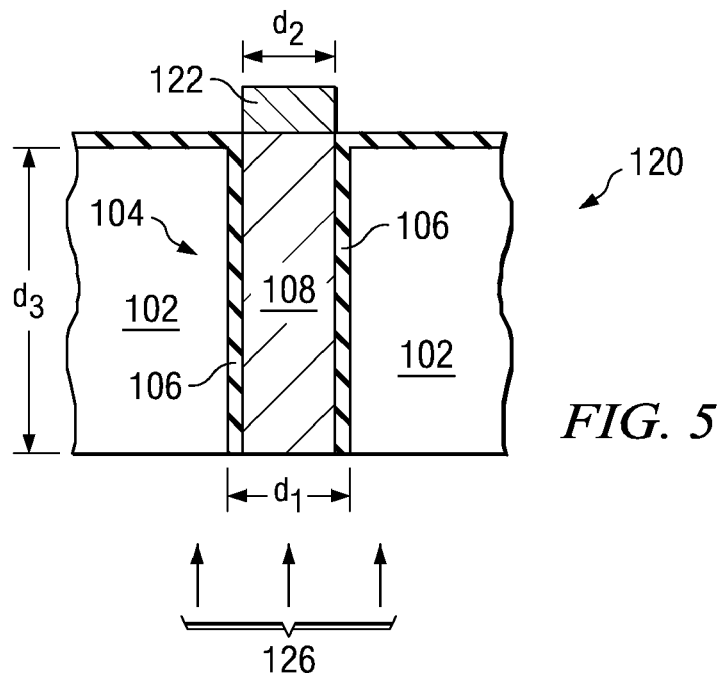

Referring again to FIG. 4, the back side or second side, e.g., the bottom side, of the workpiece 102 is ground using a grinding process 124, thinning the workpiece 102 and forming a through-silicon via from the via 104 filled with the conductive material 108, as shown in FIG. 5. The grinding process 124 removes the lower portion of the workpiece 102 beneath the via 104 and exposes the conductive material 108 in the via 104. The thickness or dimension $d_3$ of the workpiece 102 after the grinding process 124 may comprise about 15 to 30 µm, for example, although alternatively, the thinned workpiece 102 may comprise other dimensions.

A recess process 126 is used to form a recess in the conductive material 108 in the via 104, forming a landing zone, as shown in FIG. 5. The recess process 126 may comprise an etch process in some embodiments. The recess process 126 may alternatively comprise an over-polishing process. For example, the recess process 126 may comprise a part of the grinding process 124 shown in FIG. 4, in some embodiments.

Figure 6:
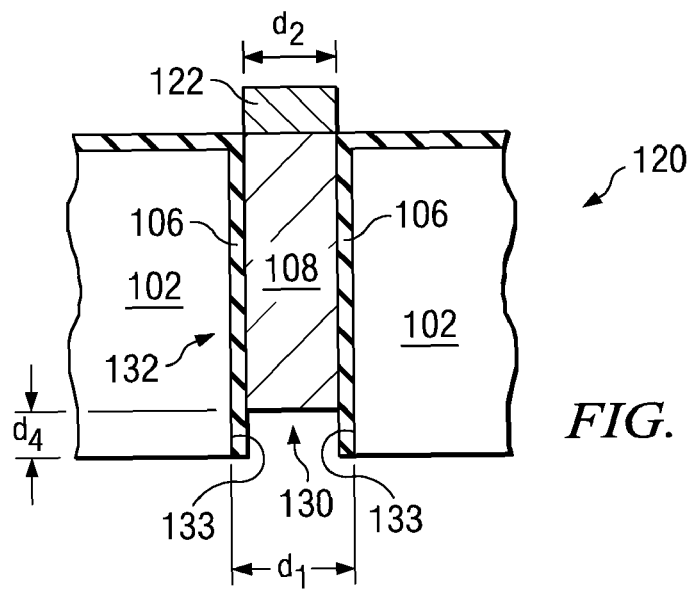

The amount of the recess or dimension $d_4$ of the recessed region 130 shown in FIG. 6 beneath the second side of the workpiece 102 may comprise about 4 to 10 µm in some embodiments, for example, although alternatively, the amount of the recess dimension $d_4$ of the recessed region 130 may comprise other dimensions. The amount of the recess or dimension $d_4$ of the recessed region 130 may be substantially the same as the thickness of the front side contact 122, for example, in some embodiments.

The recess process 126 results in the sidewalls 133 of the via 104 proximate the second side of the workpiece 102 being left uncovered by the conductive material 108 in some embodiments, as shown in FIG. 6. The conductive material 108 does not reside on sidewalls 133 of the via 104 proximate the second side of the workpiece 102 in the recessed region 130 in some embodiments, for example.

The recessed region 130 comprises a landing zone for a front side contact 122 of another workpiece 102 in accordance with embodiments of the present invention. The opening size of the recessed region 130 may vary as a function of the accuracy of a pick and place tool to be used to connect two workpieces 102 together, for example.

Thus, an interconnect structure 132 in accordance with an embodiment of the present invention includes a front side contact 122 disposed proximate a first side of the workpiece 102, a via 104 that extends through the workpiece 102, and a conductive material 108 filling the via 104 that is coupled to the contact 122 proximate the first side of the workpiece 102. The conductive material 108 comprises an elongated conductive member that extends substantially through the entire workpiece 102, except for in the recessed region 130. The interconnect structure 132 includes a recessed region 130 of the conductive material 108 proximate the second side of the workpiece 102. The interconnect structure 132 comprises a novel "through-silicon via" structure having a conductive "through" via, a plug contact 122 on the first side of the workpiece 102, and a backside contact comprising the recessed region 130 on the second side of the workpiece 102.

Figure 7:
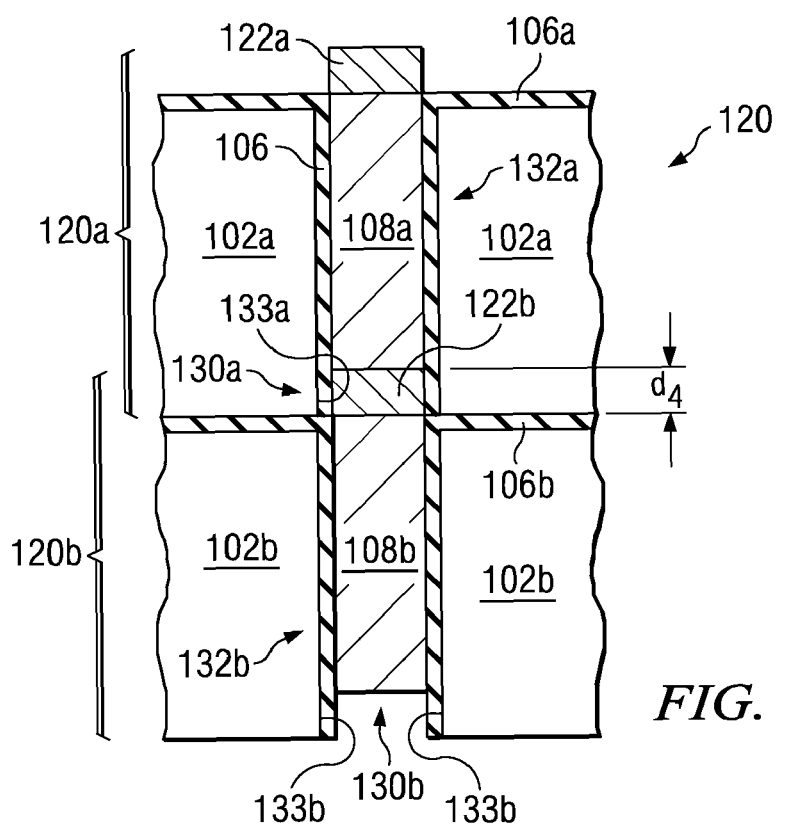

Two chips or workpieces 102a and 102b may be connected together by stacking two workpieces 102a and 102b such that the recessed region 130a of one semiconductor device 120a is connected to a front side contact 122b of another semiconductor device 120b, as shown in FIG. 7. The recessed region 130a of the interconnect structure 132a of workpiece 102a is a landing zone for a plug contact 122b of another workpiece 102b. The recessed region 130a is disposed at an opposite side of the workpiece 102a than the plug contact 122a. The recessed region 130a functions as a modified back-side contact that provides a receptacle-like plug-in location for the front side contact 122b. Two or more workpieces 102a and 102b may be stacked on top of one another using the novel interconnect structures 132a and 132b.

The interconnect structures 132a and 132b comprise through-silicon vias of the two semiconductor devices 120a and 120b that provide electrical connection between the two semiconductor devices 120a and 120b. The interconnect structures 132a and 132b may be coupled to active devices or conductive lines of the workpiece 102a and 102b, not shown, to provide electrical connection between active devices of the two semiconductor devices 120a and 120b.

The workpieces 102a and 102b may comprise semiconductor wafers upon which a plurality of die are simultaneously formed, and the die may be singulated before bonding two die together, for example. Thus, the workpieces 102a and 102b may comprise die that are portions of a semiconductor wafer, for example. Two or more die from a single workpiece or wafer may be connected together using the interconnect structures 132a and 132b described herein, or two or more die from separate workpieces may also be connected together, as examples.

The interconnect structures 132a and 132b are self-aligning and do not require alignment marks or processes for aligning the two workpieces 120a and 120b and connecting them together. The contact 122b may comprise a solderable material proximate a top surface thereof, and the workpieces 120a and 120b may be heated to cause the solder to flow and make an electrical connection, forming a 3D stacked semiconductor device 120, as shown in FIG. 7.

In the embodiment shown in FIGS. 4 through 7, the via 104 comprises substantially the same width through the entire thickness of the workpiece. For example, dimension $d_1$ is substantially the same throughout the entire thickness of the workpiece 102. Alternatively, in other embodiments, the via may be wider proximate the bottom of the via than the top of the via, as shown in the embodiment shown in FIGS. 8 through 14, which show cross-sectional views of a method of connecting together two semiconductor die in accordance with another embodiment of the present invention.

Figure 8:
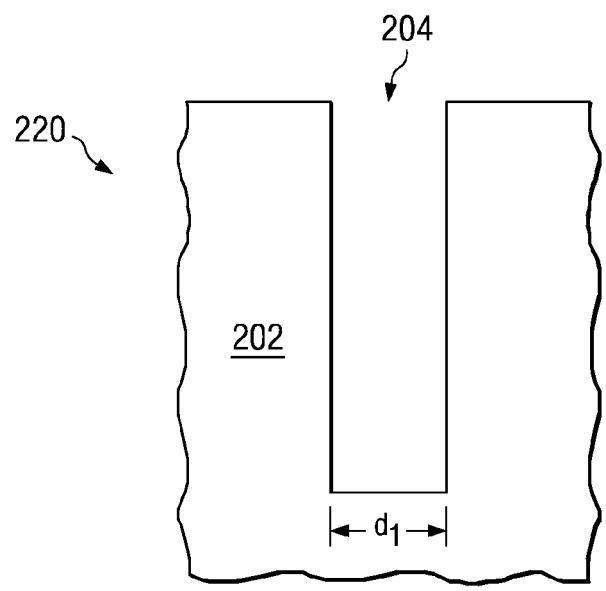
FIGS. 8 through 14 show cross-sectional views of an interconnect structure and method of connecting together two workpieces in accordance with another embodiment of the present invention.

Referring next to FIG. 8, a semiconductor device 220 includes a workpiece 202, as described in the previous embodiment. Like numerals are used for the various elements that were used to describe FIGS. 4 through 7. To avoid repetition, each reference number shown in FIGS. 8 through 14 is not described again in detail herein. Rather, similar element numbers x02, x04, x06, x08, etc . . . are used to describe the various material layers shown as were used to describe FIGS. 4 through 7, where x=1 in FIGS. 4 through 7 and x=2 in FIGS. 8 through 14. As an example, the methods of formation thereof and dimensions such as the width or dimension $d_1$ described for the via 104 in the description for FIGS. 4 through 7 may also be used for the via 204 shown in FIGS. 8 through 14.

In the embodiment shown in FIGS. 8 through 14, after the via 204 is formed in the workpiece 202, the lower portion of the via 204 is widened, before filling the via 204 with a conductive material. To widen the lower portion of the via 204, a masking material 240 is formed over the workpiece 202, lining the top surface of the workpiece 202 and upper portions of the via 204. The deposition process of the masking material 240 results in the masking material 240 not forming on the lower portion of the via 204. The masking material 240 may comprise an insulating material such as $Al_2O_3$, as an example, although other materials having an etch selectivity to the material of the workpiece 202 may also be used. The kinetic energy of the aluminum during the deposition process of the masking material 240 may be adjusted to prevent the $Al_2O_3$ from forming at the bottom of the via 204, for example.

Figure 9:
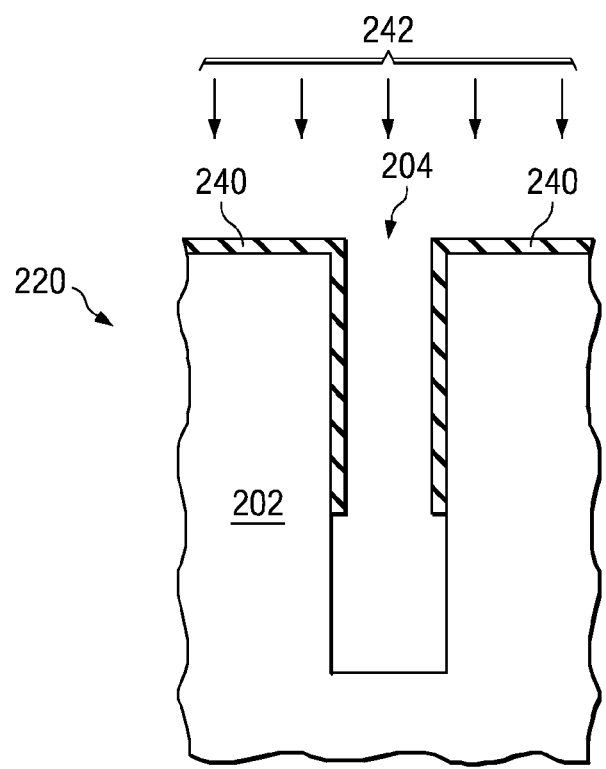

A first etch process may be used to remove undesired residues from the lower portion of the via 204. For example, a hydrofluoric (HF) etch process may be used to remove oxide residues. A second etch process 242 is then used to widen the lower portion of the via 204 that is not covered by the masking material 240, as shown in FIG. 9. The etch process 242 may comprise an isotropic etch process adapted to etch away and remove portions of the workpiece 202 substantially evenly, e.g., on the sidewalls and the lower surface of the via 204. The etch process 242 may comprise an etch process that forms a via 204 having the shape of a bottle, as shown. The etch process 242 may comprise a wet etch comprising $NH_4OH$, at a concentration of about 380:1 at a temperature of about 28 degrees C., as an example, although alternatively, other etch processes may also be used. One or more particle cleaning steps may then be performed, e.g., using HF acid or other chemicals.

Figure 10:
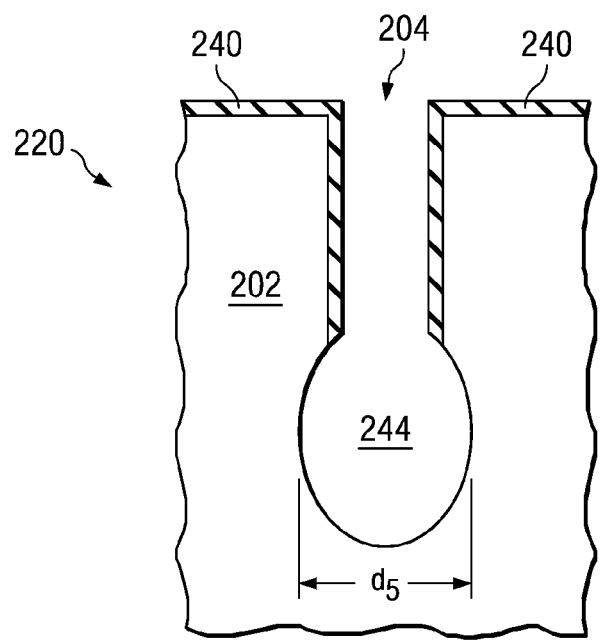

The lower portion of the via 204 may have a width or dimension $d_5$ after the etch process 242, as shown in FIG. 10, wherein dimension $d_5$ is greater than dimension $d_1$. Dimension $d_5$ may be greater than dimension $d_1$ by about 50% or less, as an example, although alternatively, dimension $d_5$ may vary from dimension $d_1$ by other amounts, e.g., greater than about 50%.

Figure 11:
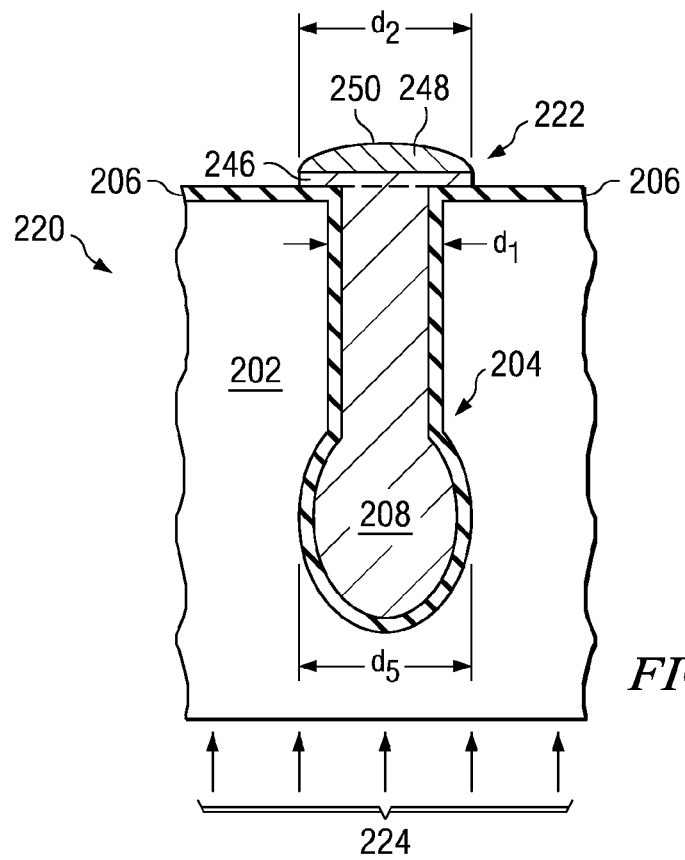

The masking material 240 is then removed from the workpiece 202, and the insulating material 206 is deposited or formed over the workpiece 202, as shown in FIG. 11. A conductive material 208 is deposited over the workpiece 202, filling the via 204. The conductive material 208 may be formed by depositing a seed layer using metal chemical vapor deposition (CVD), which lines the top surface of the workpiece and the insulating material layer 206 in the via 204. A layer of photoresist may be formed over the top surface of the workpiece 202, and may be removed over the via 204 using optical or non-optical structuring. The via 204 is then filled using electroplating or metal CVD. An organic chemical may be used to enable an electroplating bottom-up fill process that is void-free, as an example. The layer of photoresist is then stripped or removed, and the seed layer is then etched away from the top surface of the workpiece 202. Alternatively, other methods may be used to fill the via 204 with the conductive material 208, for example.

A contact 222 is formed over the via 204, wherein the contact 222 is coupled to the conductive material 208 at the first side (e.g., top side) of the workpiece 202. The contact 222 in this embodiment is shown comprising a conductive material 246 such as copper, a copper alloy, or other metals, coated with a layer of solder or a solder material 248. The contact 222 may comprise a tin/silver contact in some embodiments. The contact 222 comprises a width or dimension $d_2$ that is larger than the width or dimension $d_1$ of the via 240 proximate the contact 222. The top surface 250 of the contact 222 may be curved as shown, and the contact 222 may be thinner at edge regions than at a central region.

Figure 12:
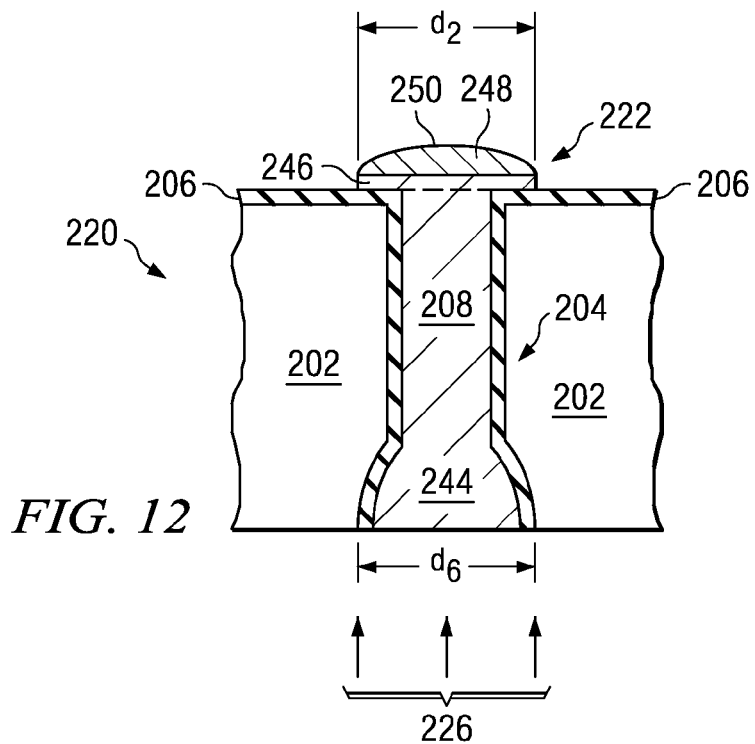

A back side grinding process 224 is then performed on the second or lower side of the workpiece 202, as shown in FIG. 11, exposing the conductive material 208 on the second side of the workpiece 202 and reducing the thickness of the workpiece 202, as shown in FIG. 12. The width of the via 204 proximate the second side of the workpiece 202 after the grinding process 224 may comprise a dimension $d_6$, wherein dimension $d_6$ may be substantially the same as dimension $d_5$, the largest width of the via 204 after the via 204 lower portion is widened, for example. Alternatively, if the grinding process 224 is discontinued at a location in the workpiece 202 above or below the largest width or dimension $d_5$ of the via 204, then dimension $d_6$ may be less than dimension $d_5$, as shown in FIG. 12, wherein the grinding process 224 was discontinued at a point above dimension $d_5$. In some embodiments, the grinding process 224 may be discontinued at a point such that the width of the lower portion of the via 204, dimension $d_6$, is substantially the same as the width or dimension $d_2$ of the front side contact 222.

The width or dimension $d_6$ of the via 204 proximate the second side of the workpiece 202 may be about 1 μm or greater larger than the width or dimension $d_1$ of the via 204 proximate the first side of the workpiece 202 in some embodiments, as an example.

Figure 13:
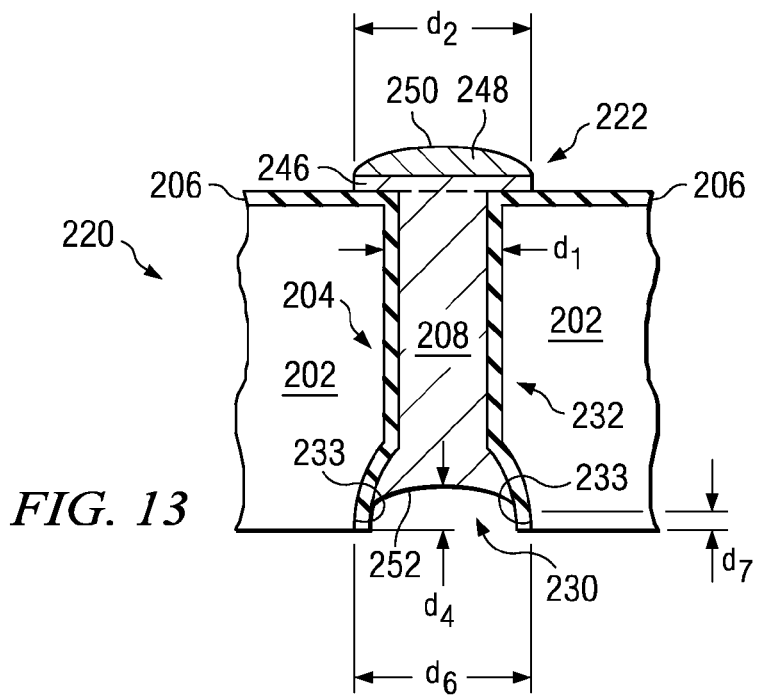

The conductive material 208 is recessed proximate the second side or bottom side of the workpiece 202 using a recess process 226, as shown in FIG. 12, resulting in the structure shown in FIG. 13. The conductive material 208 may be removed from adjacent the sidewalls 233 of the via 204 proximate the second side of the workpiece 202, as shown. The recess process 226 may comprise a separate additional etch process, or the recess process 226 may comprise an over-polish of the grinding process 224, as described for the previous embodiment. The recess process 226 may result in more conductive material 208 being removed from a central region of the via 204 that at the sidewalls 233, so that the central region of the recessed region 230 comprises a dimension $d_4$ within the second side of the workpiece 202 and the edge regions of the recessed region 230 proximate the sidewalls 233 of the via 204 comprise a dimension $d_7$, wherein dimension $d_7$ is less than dimension $d_4$.

The insulating material layer 206 may be left remaining on sidewalls proximate the second side of the workpiece 202, as shown. The etch process to recess the conductive material 108 and 208 may comprise a selective etch process adapted to remove the conductive material 108 and 208 but not the insulating material layer 106 and 206 in some embodiments, for example.

Figure 14:
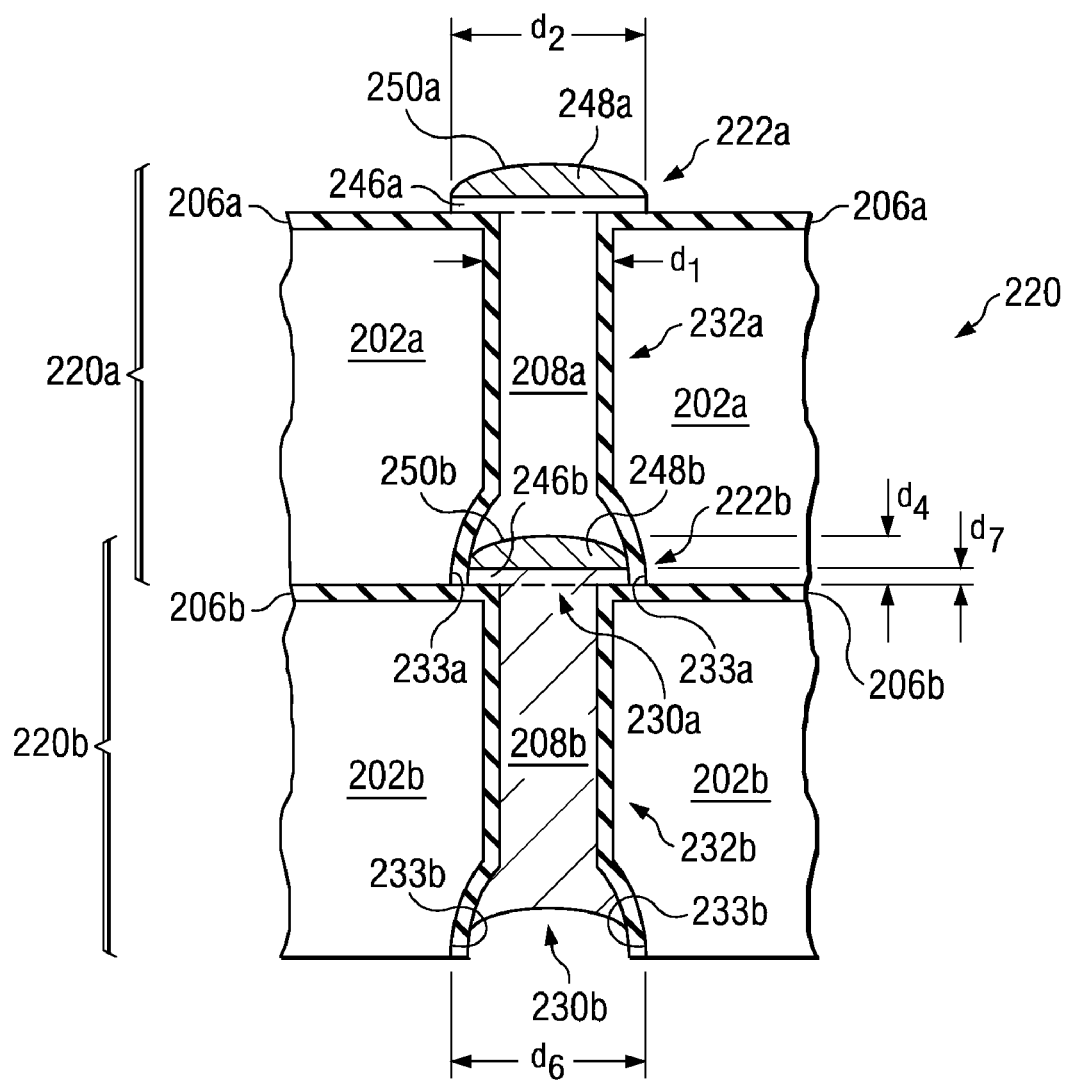

FIG. 14 illustrates a semiconductor device 220 wherein two semiconductor devices 220a and 220b are connected together using interconnect structures 232a and 232b in accordance with an embodiment of the present invention. Front side contact 222b of a semiconductor device 220b or die is coupled to and electrically connected to the recessed region 230a of semiconductor device or die 220a. The workpieces 202a and 202b comprise chips that are stacked after wafer dicing, and the solder 250 is reflowed, e.g., heated, to connect the back side contact comprising the recessed region 230a to the front side contact 222b. The solder 248b of the front side contact 222b electrically and mechanically connects the two interconnect structures 232a and 232b comprising the through-silicon vias together.

The recessed region 230a is adapted to accommodate the fit of the front side contact 222b. For example, the recessed region 230a comprises a width, thickness, and shape in a top view adapted to accommodate the width, thickness, and shape in a top view of the front side contact 222b. Recessed regions 230a and 230b and front side contacts 222a and 222b across each workpiece 202a and 202b and for a plurality of workpieces 202a and 202b may comprise similar size, shapes, and dimensions, so that two or more workpieces 202a and 202b may be connected together using the novel interconnect structures 232a and 232b in accordance with embodiments of the present invention. The widened via opening at the second side of the workpiece 202a improves and facilitates the ability to insert a front side contact 222b of another workpiece 202b into the recessed region 230a.

In the embodiment shown in FIGS. 8 through 14, a portion of the conductive material 208 may also remain on sidewalls of the via 204, e.g., over the insulating material layer 206. For example, if an over-polish process is used as the recess process 226, only the central portion of the conductive material 208 in the via 204 may be recessed, leaving the conductive material 208 on the sidewalls of the via 204 proximate the second side of the workpiece 202 (not shown in the drawings).

Embodiments of the present invention are described herein as being implemented in semiconductor devices, e.g., semiconductor chips or die. Embodiments of the present invention may also be implemented in other technologies where devices are formed on a workpiece, and where it is desirable to stack two or more workpieces and connect them with conductive vias through the workpiece. For example, embodiments of the present invention also have useful application in solar cell devices, which may also be fabricated on a workpiece or substrate. Other applications where it is desirable to have a self-aligning structure that also provides an electrical connection would also benefit from the novel interconnect structures and methods described herein.

Advantages of embodiments of the invention include providing novel interconnect structures 132, 132a, 132b, 232, 232a, and 232b and methods for semiconductor devices 120, 120a, 120b, 220, 220a, and 220b and other types of devices. The interconnect structures 132, 132a, 132b, 232, 232a, and 232b comprise through-workpiece conductive vias wherein the front side contacts 122, 122a, 122b, 222, 222a, and 222b comprise plug contacts that protrude from the first side of the workpieces 102, 102a, 102b, 202, 202a, and 202b. The back side contacts comprise recessed regions 130 and 230 that are adapted to accommodate the fit of the front side contacts 122, 122a, 122b, 222, 222a, and 222b of another workpiece 102, 102a, 102b, 202, 202a, and 202b. Thus, no alignment marks are needed to align two stacked workpieces 102, 102a, 102b, 202, 202a, and 202b when connecting together the interconnect structures 132, 132a, 132b, 232, 232a, and 232b of two or more workpieces 102, 102a, 102b, 202, 202a, and 202b.

Furthermore, because the landing zone comprises a recessed region 130, 130a, 130b, 230, 230a, and 230b, a deposition process, lithography process, patterning process, and etch process are not needed to form back side contacts. Rather, the recessed regions 130, 130a, 130b, 230, 230a, and 230b that function as back side contacts in the interconnect structures 132, 132a, 132b, 232, 232a, and 232b are formed by a single recess process 126 or 226 comprising an etch process or an over-polish process, saving manufacturing time and costs.

The methods of manufacturing the interconnect structures 132, 132a, 132b, 232, 232a, and 232b described herein may advantageously be processed with existing tooling in manufacturing facilities.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnect structure for a workpiece comprising a semiconductor die and having a first side and a second side, comprising:
   a via extendable through the workpiece from the first side of the workpiece to the second side of the workpiece, the via being partially filled with a conductive material from the first side to an area proximate the second side of the workpiece, the via comprising sidewalls, the conductive material in the via forming a recessed region at the area proximate the second side of the workpiece; and
   a contact coupled to the conductive material in the via proximate the first side of the workpiece, the contact adapted to fit within a recessed region comprising a landing zone of an identical interconnect structure of another workpiece having a first side and a second side, the recessed region of the other workpiece proximate the second side of the other workpiece,
   wherein a width of the contact is substantially the same as a width of the recessed region of the other workpiece at a surface of the second side thereof prior to interconnection of the other workpiece to the workpiece.

2. The interconnect structure according to claim 1, wherein the conductive material does not reside on sidewalls of the via proximate the second side of the workpiece.

3. The interconnect structure according to claim 1, wherein the via comprises a first width, wherein the contact comprises a second width, the second width being substantially the same as or less than the first width.

4. The interconnect structure according to claim 1, wherein the via comprises a first width proximate the first side of the workpiece and a second width proximate the second side of the workpiece, the second width being greater than the first width.

5. The interconnect structure according to claim 1, wherein the via comprises substantially the same width through the entire workpiece.

6. The interconnect structure according to claim 1, wherein the contact comprises a first height, wherein the recessed region of the conductive material in the via comprises a second height, the second height being substantially the same as the first height.

7. An interconnect structure for a workpiece comprising a semiconductor die and having a first side and a second side, comprising:
  a via extendable through the workpiece from the first side of the workpiece to the second side of the workpiece, the via comprising a first width proximate the first side of the workpiece and a second width proximate the second side of the workpiece, the second width being greater than the first width, the via being partially filled with a conductive material, the conductive material in the via forming a recessed region at an area proximate the second side of the workpiece; and
  a contact coupled to the conductive material in the via proximate the first side of the workpiece, the contact adapted to fit within a recessed region comprising a landing zone of an identical interconnect structure of another workpiece having a first side and a second side, the recessed region of the other workpiece proximate the second side of the other workpiece
  wherein a width of the contact is substantially the same as a width of the recessed region of the other workpiece at a surface of the second side thereof prior to interconnection of the other workpiece to the workpiece.

8. The interconnect structure according to claim 7, wherein the contact comprises a third width, the third width comprising substantially the same width as the second width.

9. The interconnect structure according to claim 7, wherein the second width is greater than the first width by about 50% or less.

10. The interconnect structure according to claim 7, wherein the workpiece comprises a semiconductor workpiece or a solar cell workpiece.

11. The interconnect structure according to claim 7, wherein the contact comprises a conductive material and a solder material disposed over the conductive material.

12. A semiconductor device, comprising:
  a workpiece comprising a semiconductor die and having a first side and a second side; and
  an interconnect structure disposed in the workpiece, the interconnect structure comprising a via extending through the workpiece from the first side of the workpiece to an area proximate the second side of the workpiece, the via being partially filled with a conductive material, the conductive material in the via forming a recessed region at the area proximate the second side of the workpiece, the interconnect structure including a contact coupled to the conductive material in the via proximate the first side of the workpiece, the contact adapted to fit within a recessed region comprising a landing zone of an identical interconnect structure of another workpiece having a first side and a second side, the recessed region of the other workpiece proximate the second side of the other workpiece,
  wherein a width of the contact is substantially the same as a width of the recessed region of the other workpiece at a surface of the second side thereof prior to interconnection of the other workpiece to the workpiece.

13. A semiconductor device comprising a plurality of workpieces according to claim 12 coupled together by at least one contact and at least one landing zone of the interconnect structure of adjacent workpieces.

14. The semiconductor device according to claim 12, wherein the interconnect structure comprises a self-aligning, plug-in, through-silicon via.

* * * * *